(12) United States Patent
Liu et al.

(10) Patent No.: US 7,863,936 B1
(45) Date of Patent: Jan. 4, 2011

(54) DRIVING CIRCUIT WITH IMPEDENCE CALIBRATION AND PRE-EMPHASIS FUNCTIONALITIES

(75) Inventors: Chih-Min Liu, Grand Cayman (KY); Ping-Hung Yin, Grand Cayman (KY); Kuo-Chan Huang, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 0 days.

(21) Appl. No.: 12/785,505

(22) Filed: May 24, 2010

Related U.S. Application Data

(63) Continuation-in-part of application No. 12/628,226, filed on Dec. 1, 2009.

(51) Int. Cl.
*H03K 19/094* (2006.01)
*H03K 19/0175* (2006.01)

(52) U.S. Cl. .............................. 326/86; 326/26; 326/82; 326/87

(58) Field of Classification Search ........................ None
See application file for complete search history.

(56) References Cited

U.S. PATENT DOCUMENTS 4,918,336 A    4/1990   Graham
5,977,796 A    11/1999  Gabara
6,111,431 A    8/2000   Estrada
6,356,141 B1   3/2002   Yamauchi
6,590,422 B1   7/2003   Dillon
6,686,772 B2   2/2004   Li
6,731,135 B2   5/2004   Brunolli
6,900,663 B1   5/2005   Roper
6,977,534 B2 * 12/2005  Radelinow .................. 327/112
7,012,450 B1   3/2006   Oner
7,248,079 B2   7/2007   Bhattacharya
7,382,160 B2   6/2008   Nagano
2003/0085736 A1   5/2003   Tinsley
2003/0193350 A1   10/2003  Chow
2004/0246026 A1   12/2004  Wang
2007/0115034 A1 * 5/2007   Nguyen et al. .............. 327/112
2007/0241795 A1   10/2007  Kwasniewski
2009/0180570 A1   7/2009   Koh

* cited by examiner

*Primary Examiner*—Anh Q Tran
(74) *Attorney, Agent, or Firm*—Winston Hsu; Scott Margo (57) ABSTRACT

A driving circuit includes at least a driving unit, a first processing unit and a second processing unit. The driving circuit includes a first bias component, a second bias component, a first pre-emphasis unit, a second pre-emphasis unit, and a transmitter unit. The first bias component has a first node coupled to a first reference voltage and a second node for outputting a first bias current. The second bias component has a first node for draining a second bias current and a second node coupled to a second reference voltage different from the first reference voltage.

22 Claims, 12 Drawing Sheets

DRIVING CIRCUIT WITH IMPEDENCE CALIBRATION AND PRE-EMPHASIS FUNCTIONALITIES

CROSS REFERENCE TO RELATED APPLICATIONS

This continuation-in-part application claims the benefit of co-pending U.S. application Ser. No. 12/628,226, filed on Dec. 1, 2009, and incorporated herein by reference.

BACKGROUND OF THE INVENTION

1. Field of the Invention

The present invention relates to a driver, and more particularly, to a low-power high-speed driving circuit with auto-calibration and pre-emphasis functionalities.

2. Description of the Prior Art

Figure 1:
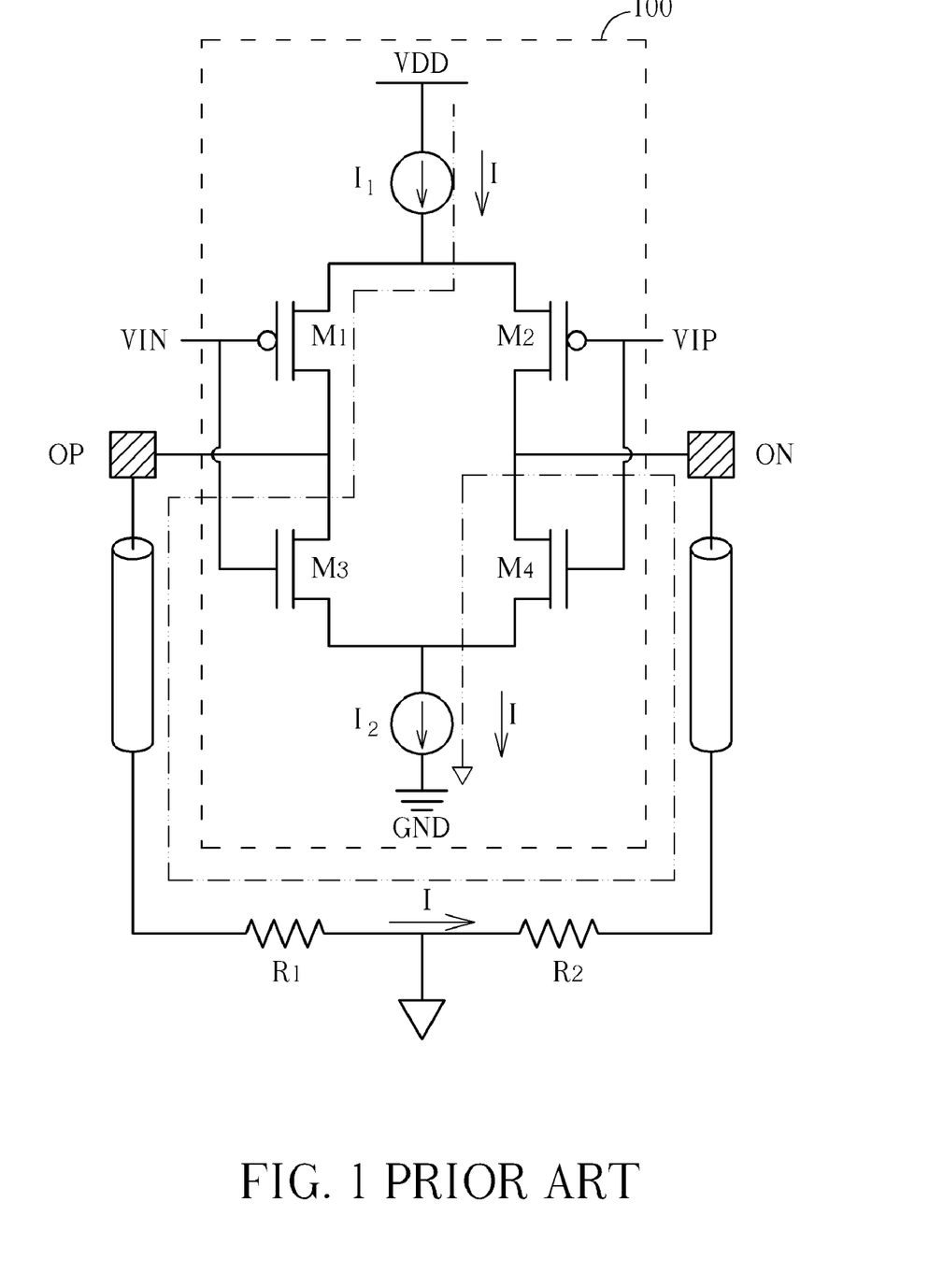
FIG. 1 is a diagram illustrating a conventional LVDS driver for driving loads.

As the resolution of image sensors or displays increases, the data rate becomes very high. As a result, a requirement for a high-speed driver with superior performance grows. For all kinds of high-speed drivers, a low voltage differential signal (LVDS) technique is frequently utilized due to a lower electromagnetic interference (EMI), lower power consumption and a better signal integrity than that of a conventional CMOS full swing driver. Please refer to FIG. 1, which is a diagram of a conventional LVDS driver for driving a pair of loads $R_1$ and $R_2$. The conventional LVDS driver 100 is composed of two PMOS transistors $M_1$, $M_2$, two NMOS transistors $M_3$, $M_4$, and two constant current sources $I_1$ and $I_2$ connected to a reference supply voltage VDD and a reference ground GND, respectively, wherein each current source $I_1$, $I_2$ has a constant current I flowing through. The transistors $M_2$ and $M_4$ are connected to a first input voltage VIP of a differential signal pair through their gates and transistors $M_1$ and $M_3$ are connected to a second input voltage VIN of the differential signal pair through their gates. When the first input voltage VIP is high (which implies that the second input voltage VIN is low), the transistors $M_1$ and $M_4$ are switched on and the current I flows through, successively, the reference supply voltage VDD, the current source $I_1$, the transistor $M_1$, the loads $R_1$ and $R_2$, the transistor $M_4$, the current source $I_2$ and finally the reference ground GND. Assuming a 1.25V common mode voltage is sustained at output nodes OP, ON and the loads $R_1$ and $R_2$ are both equivalently 50 ohms, the biasing current I can be derived as 2 mA for a typical output swing of ±0.2V at the output nodes OP and the output node ON.

Signals transmitted through a long transmission distance suffer from the loss of the high-frequency part of the transmitted signals; therefore, a conventional driving circuit usually employs a pre-emphasis functionality to emphasize the transmitted signal at its rising and falling parts, i.e., enhancing high-frequency components of the transmitted signal. The conventional pre-emphasis functionality, however, usually requires additional circuitry and will inevitably entail higher fabrication costs.

In addition, as the data rate rises up to giga bits per second (Gbps) and the cable length becomes longer, the impedance matching issue becomes crucial to prevent signal reflection at both the transmitter and receiver side. For the LVDS driver 100 shown in FIG. 1, impedance matching means that the impedance towards each side of the output node OP (or the output node ON) should be conjugate with each other. Since the load $R_1$ driven by a signal traveling from the output node ON through a cable has a resistance of 50 ohms as well as a characteristic impedance of the cable, the impedance towards the opposite side against the load $R_1$ should also be 50 ohms to match the load $R_1$. However, for the LVDS driver 100 in FIG. 1, when the first input voltage VIP is high, the impedance towards the opposite side against the load $R_1$ is almost infinite (the connection to the transistor $M_3$ is open circuited and the connection to the transistor $M_1$ and the current source $I_1$ is also open circuited), and therefore the required matching is out of the question.

Figure 2:
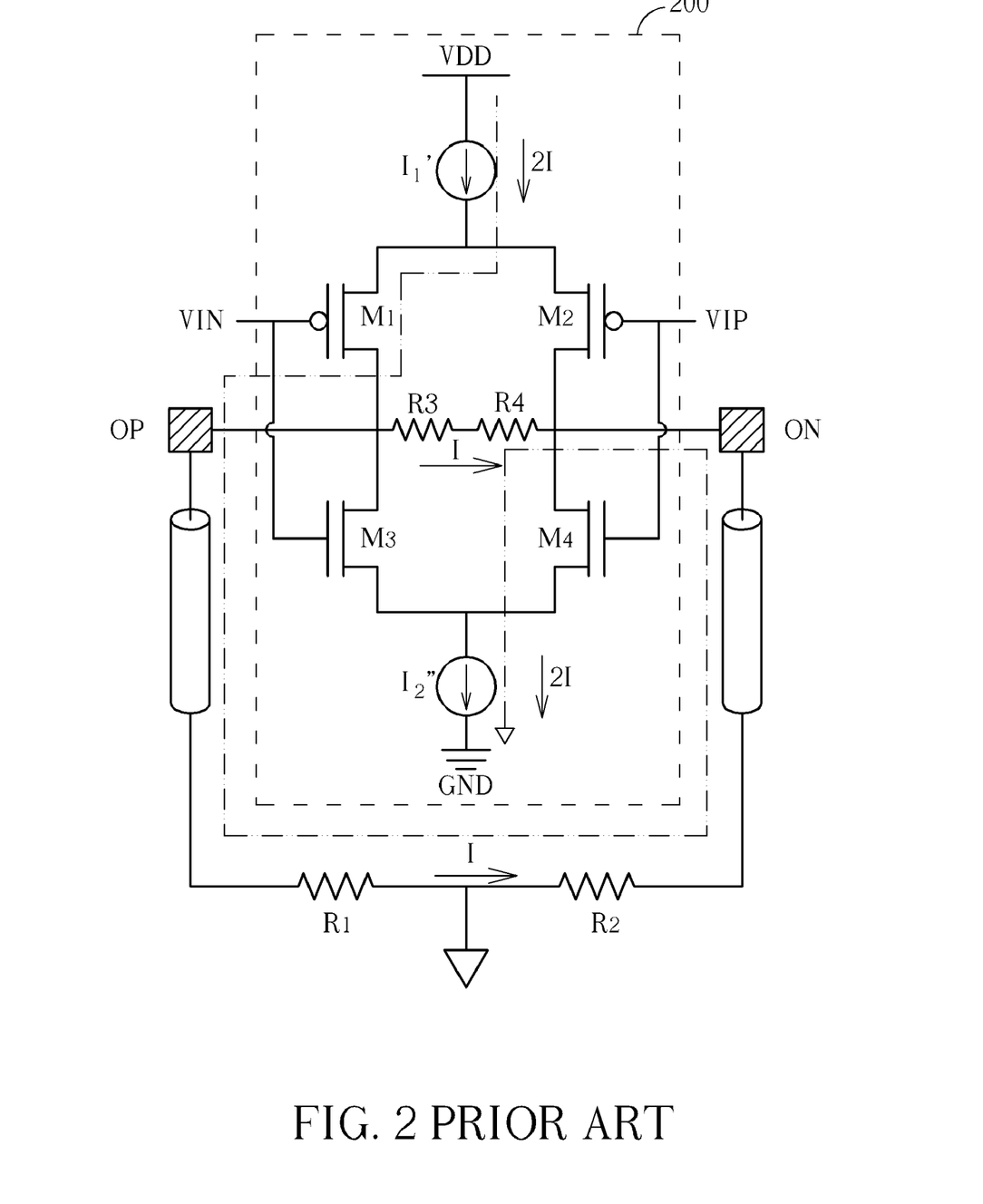
FIG. 2 is a diagram illustrating a conventional LVDS driver with matching resistors implemented therein.

Please refer to FIG. 2, which is a diagram of a conventional LVDS driver 200 with matching resistors R3 and R4 implemented therein. The conventional LVDS driver 200 is composed of two PMOS transistors $M_1$, $M_2$, two NMOS transistors $M_3$, $M_4$, and two constant current sources $I_1'$ and $I_2'$ connected to a reference supply voltage VDD and a reference ground GND, respectively, wherein each current source $I_1'$, $I_2'$ has a constant current 2*I flowing through. The matching resistors $R_3$ and $R_4$ are both designed as 50 ohms to match loads $R_1$ and $R_2$, respectively. For the LDVS driver 200 in FIG. 2, the impedance towards the opposite side against the load $R_1$ is the matching resistor $R_3$ and therefore a proper matching can be achieved. Unfortunately, this modified LVDS driver 200 accomplishes the proper matching at the expense of extra current flowing through the matching resistors $R_3$ and $R_4$, thereby doubling the overall power consumption.

Figure 3:
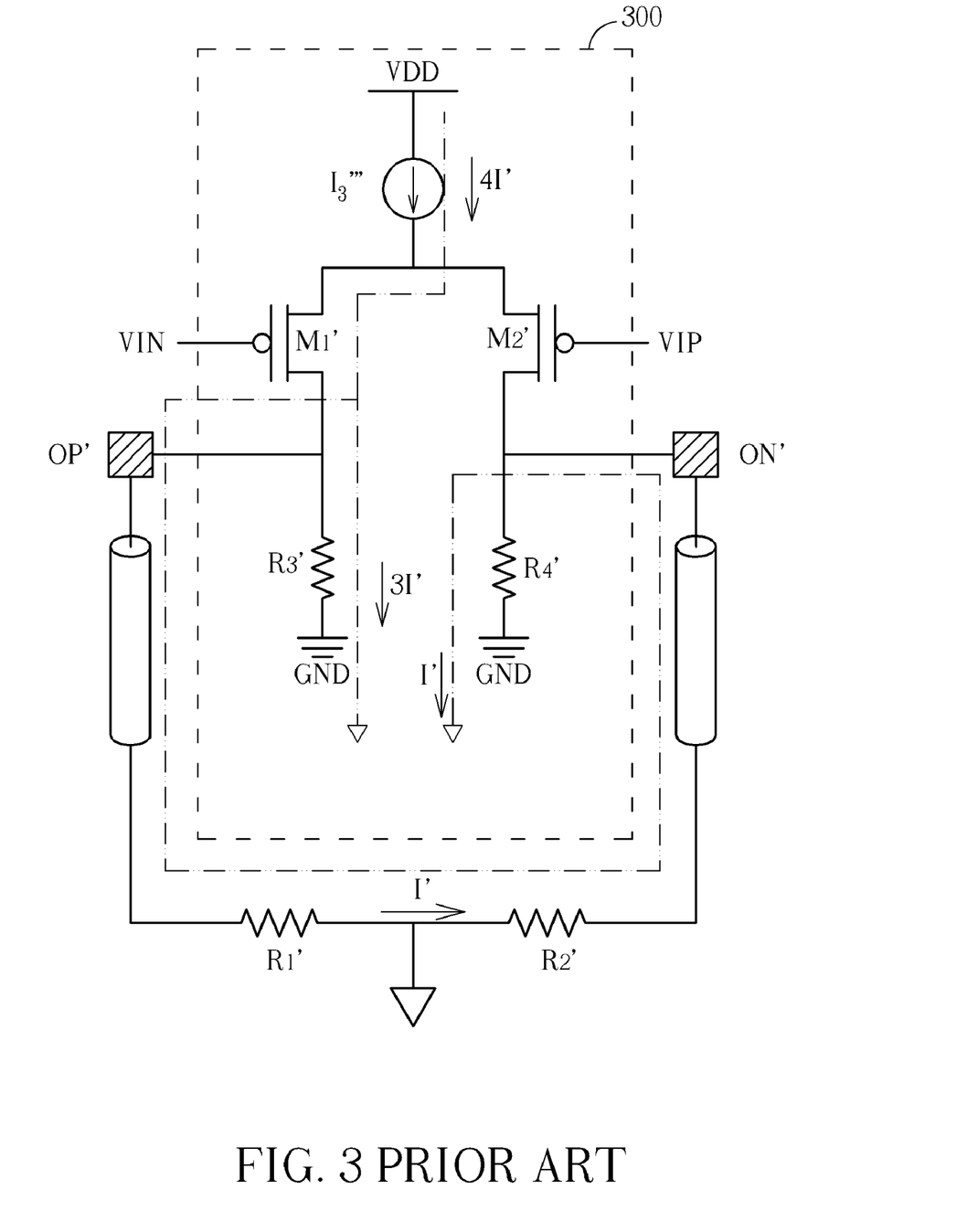
FIG. 3 is a diagram illustrating a modified LVDS driver for the MIPI standard.

For some applications, the applied driver has to further fulfill other specification requirements: for example, the Mobile Industry Processor Interface (MIPI) standard demands a very low supply voltage of 0.4V, and a common mode voltage of 0.2V while maintaining an output swing of ±0.1V. In this case, a tail current source connecting reference ground cannot be applied. Please refer to FIG. 3, which is a diagram of a conventional LVDS driver 300 for MIPI standard. The conventional LVDS driver 300 is composed of two PMOS transistors $M_1'$, $M_2'$, two resistors $R_3$, $R_4$ connected to a reference ground GND, and a constant current source $I_3'''$ connected to a reference supply voltage VDD, wherein the current source $I_3'''$ has a constant current 4*I' flowing through. When the first input voltage VIP is high, the current from the current source $I_3'''$ travels through the transistor M1' and then splits into two: one quarter of the current keeps driving the loads $R_1'$ and $R_2'$ and then travels toward the reference ground GND through the resistor $R_4'$; while the remaining current is conducted to the reference ground GND through the resistor $R_3'$. To fulfill the specification requirements of the MIPI standard, the current 4*I' sourced from the current source $I_3'''$ is equal to 8 mA, and each of the resistors $R_1'$, $R_2'$, $R_3'$ and $R_4'$ is 50 ohms to achieve proper matching. The LDVS driver 300 shown in FIG. 3 can successively meet the requirements of the MIPI standard but still suffers from over-large power consumption (8 mA for one single driver).

SUMMARY OF THE INVENTION

In light of this, an exemplary embodiment of the present invention provides a novel driving circuit (e.g., a novel LDVS driver) capable of achieving the same performance with less power consumption and supporting the pre-emphasis functionality without the addition of complex circuitry.

An exemplary driving circuit of the present invention comprises at least a driving unit having a first bias component, a second bias component, a first pre-emphasis units, a second pre-emphasis unit, a transmitter unit, a first processing unit and a second processing unit. The first bias component has a first node coupled to a first reference voltage, and a second node for outputting a first bias current. The second bias component has a first node for draining a second bias current, and a second node coupled to a second reference voltage different from the first reference voltage. The first pre-emphasis unit receives a first driving signal and a first pre-emphasis control signal, and generates a first pre-emphasis output signal according to the first driving signal and the first pre-emphasis control signal. The second pre-emphasis unit receives a second driving signal and a second pre-emphasis control signal, and generates a second pre-emphasis signal according to the second driving signal and the second pre-emphasis control signal. The transmitter unit is coupled to a first output port a second port of the driving circuit, and is for receiving the first pre-emphasis signal and the second pre-emphasis signal.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
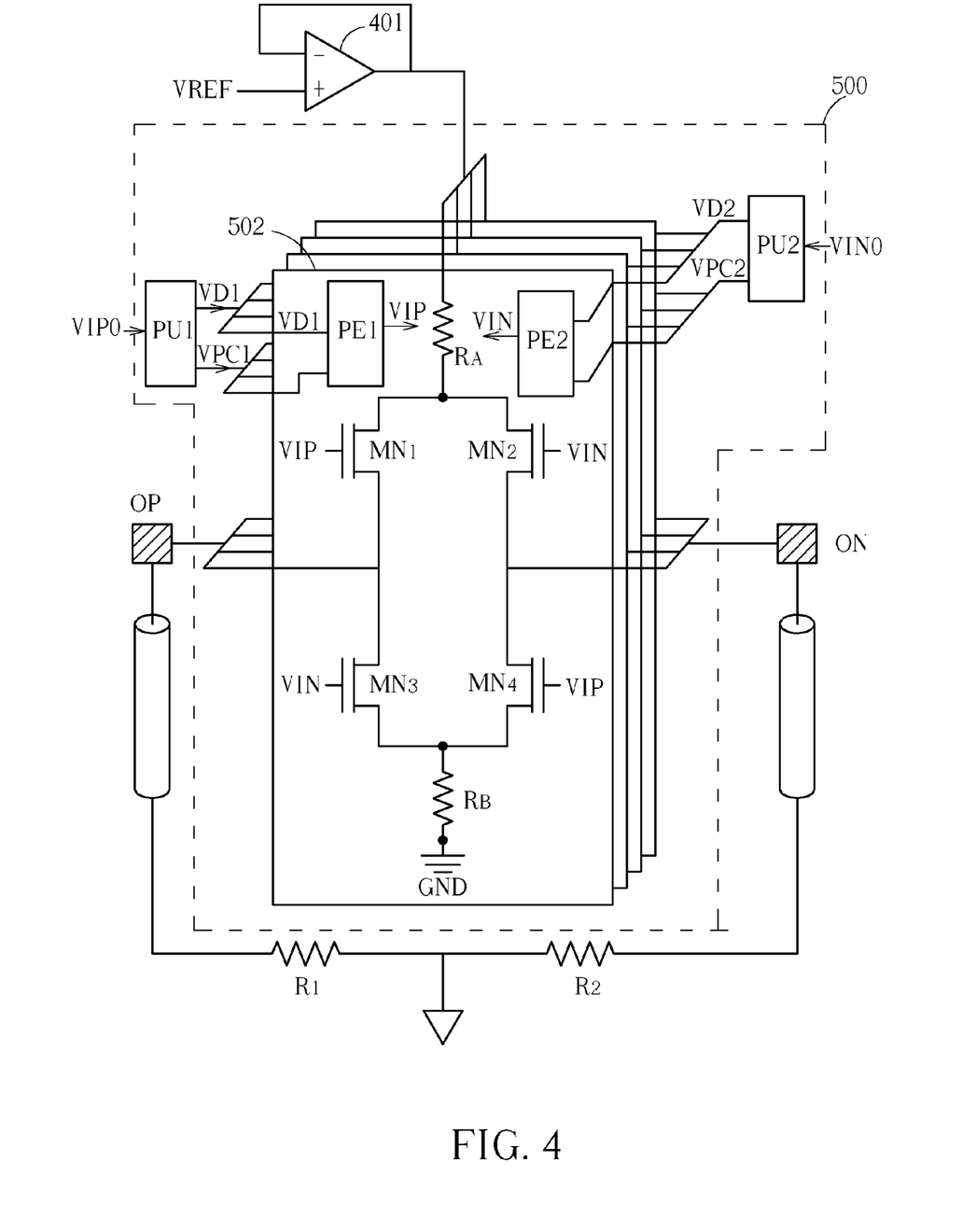
FIG. 4 is a diagram illustrating a driving circuit according to an embodiment of the present invention.

Please refer to FIG. 4, which shows a driving circuit (e.g., an LDVS driver) according to an embodiment of the present invention. The exemplary driving circuit 400 includes, but is not limited to, a first processing unit PU1, a second processing unit PU2 and a plurality of driving units. In FIG. 4, only a driving unit 402 is illustrated with detail here for simplicity since each driving unit is designed to have the same circuit structure. The driving unit 402 includes a first pre-emphasis unit PE1, a second pre-emphasis unit PE2, a first bias component $R_A$, a second bias component $R_B$, a first metal-oxide-semiconductor (MOS) transistor $MN_1$, a second MOS transistor $MN_2$, a third MOS transistor $MN_3$, and a fourth MOS transistor $MN_4$, where the first, second, third, and fourth MOS transistors $MN_1$-$MN_4$ have the same conductive type. By way of example, rather than limitation, the first and second bias components $R_A$ and $R_B$ are implemented using resistors, and the first, second, third, and fourth MOS transistors are N-channel metal-oxide-silicon (NMOS) transistors for a lower threshold voltage. However, this is for illustrative purposes only. Any driving circuit that follows the exemplary circuit architecture shown in FIG. 4 to configure interconnections of implemented bias components and MOS transistors falls within the scope of the present invention.

The first bias component $R_A$ has a first node N11 coupled to a first reference voltage TXVDD and a second node N12 for outputting a first bias current $I_A$. The second bias component $R_B$ has a first node N21 for draining a second bias current $I_B$ (which is identical to the first bias current $I_A$ in this exemplary embodiment) and a second node N33 coupled to a second reference voltage GND different from the first reference voltage TXVDD. The first pre-emphasis unit PE1 receives a first driving signal VD1 and a first pre-emphasis control signal VPC1, and generates a first pre-emphasis output signal VIP according to the first driving signal VD1 and the first pre-emphasis control signal VPC1. The first MOS transistor $MN_1$ has a control node NA1 coupled to the first pre-emphasis unit PE1 for receiving the first pre-emphasis signal VIP generated from the first pre-emphasis unit PE1, a first connection node NB1 coupled to the second node N12 of the first bias component $R_A$, and a second connection node NC1 coupled to a first output port of the driving unit 402. The second MOS transistor $MN_2$ has a control node NA2 coupled to the second pre-emphasis unit PE2 for receiving the second pre-emphasis signal VIN generated from the second pre-emphasis unit PE2, a first connection node NB2 coupled to the second node N12 of the first bias component $R_A$, and a second connection node NC2 coupled to a second output port of the driving unit 402. The third MOS transistor $MN_3$ has a control node NA3 coupled to the second pre-emphasis unit PE2 for receiving the second pre-emphasis signal VIN generated from the second pre-emphasis unit PE2, a first connection node NB3 coupled to the first output port of the driving unit, and a second connection node NC3 coupled to the first node N21 of the second bias component $R_B$. The fourth MOS transistor $MN_4$ has a control node NA4 coupled to the first pre-emphasis unit PE1 for receiving the first pre-emphasis signal VIP generated from the first pre-emphasis unit PE1, a first connection node NB4 coupled to the second output port of the driving unit, and a second connection node NC4 coupled to the first node N21 of the second bias component $R_B$.

As can be seen from the diagram, the first pre-emphasis unit PE1 receives the first driving signal VD1 and the first pre-emphasis control signal VPC1 to generate the first pre-emphasis signal VIP, and the second pre-emphasis unit PE2 receives the second driving signal VD2 and the second pre-emphasis control signal VPC2 to generate the second pre-emphasis signal VIN. The gates of the first and fourth MOS transistors (NMOS transistors) $MN_1$ and $MN_4$ are therefore connected to the first pre-emphasis signal VIP; and the gates of the second and third MOS transistors (NMOS transistors) $MN_2$ and $MN_3$ are therefore connected to the second pre-emphasis signal VIN. A clean and stable supply voltage TXVDD is provided via a buffer 401 with a bandgap reference voltage VREF. The first and second MOS transistors (NMOS transistors) $MN_1$ and $MN_2$ are connected to the supply voltage TXVDD via the first bias component (e.g., a resistor) $R_A$ in this embodiment; while the third and fourth MOS transistors (NMOS transistors) $MN_3$ and $MN_4$ are connected to a reference ground GND via the second bias component (e.g., a resistor) $R_B$ in this embodiment. When the first pre-emphasis signal VIP is high, the first current $I_A$ is conducted from the supply voltage TXVDD, flowing through the first bias component $R_A$, the first MOS transistor $MN_1$, the loads $R_1$ and $R_2$, the fourth MOS transistor $MN_4$ and finally through the second bias component RB to the reference ground GND. Considering the impedance matching issue, to match the impedance of the load $R_1$ at one side of the output node OP, an impedance towards the other side of the output node OP should be equal to the impedance of the load $R_1$; namely, an on-resistance in series with the first bias component $R_A$ which is a resistor in this exemplary embodiment. Likewise, a proper matching at the output node ON can also be derived by adjusting the second bias component $R_B$ which is a resistor in this exemplary embodiment. Considering the MIPI standard, the supply voltage should be 0.4V whereas the loads $R_1$ and $R_2$ are both 50 ohms, and the resistance of the first and second bias components RA and RB are 50 ohms minus on-resistance of the first MOS transistor $MN_1$ and 50 ohms minus on-resistance of the MOS transistor $MN_4$, respectively. In an ideal case, the on-resistances of the MOS transistors are zero, and thereby the resistances of the first and second bias components (e.g., resistors) $R_A$ and $R_B$ are both 50 ohms. Therefore, in accordance with an exemplary embodiment of the present invention, a driving unit (i.e., a driver) consuming only 2 mA without sacrificing any operation performance is proposed. Compared with the conventional LDVS driver 300 in FIG. 3, each single driver implemented using the proposed driving unit architecture can save 6 mA, and since the MIPI standard requires five drivers, a total current of 30 mA can be saved according to the present invention.

Figure 5:
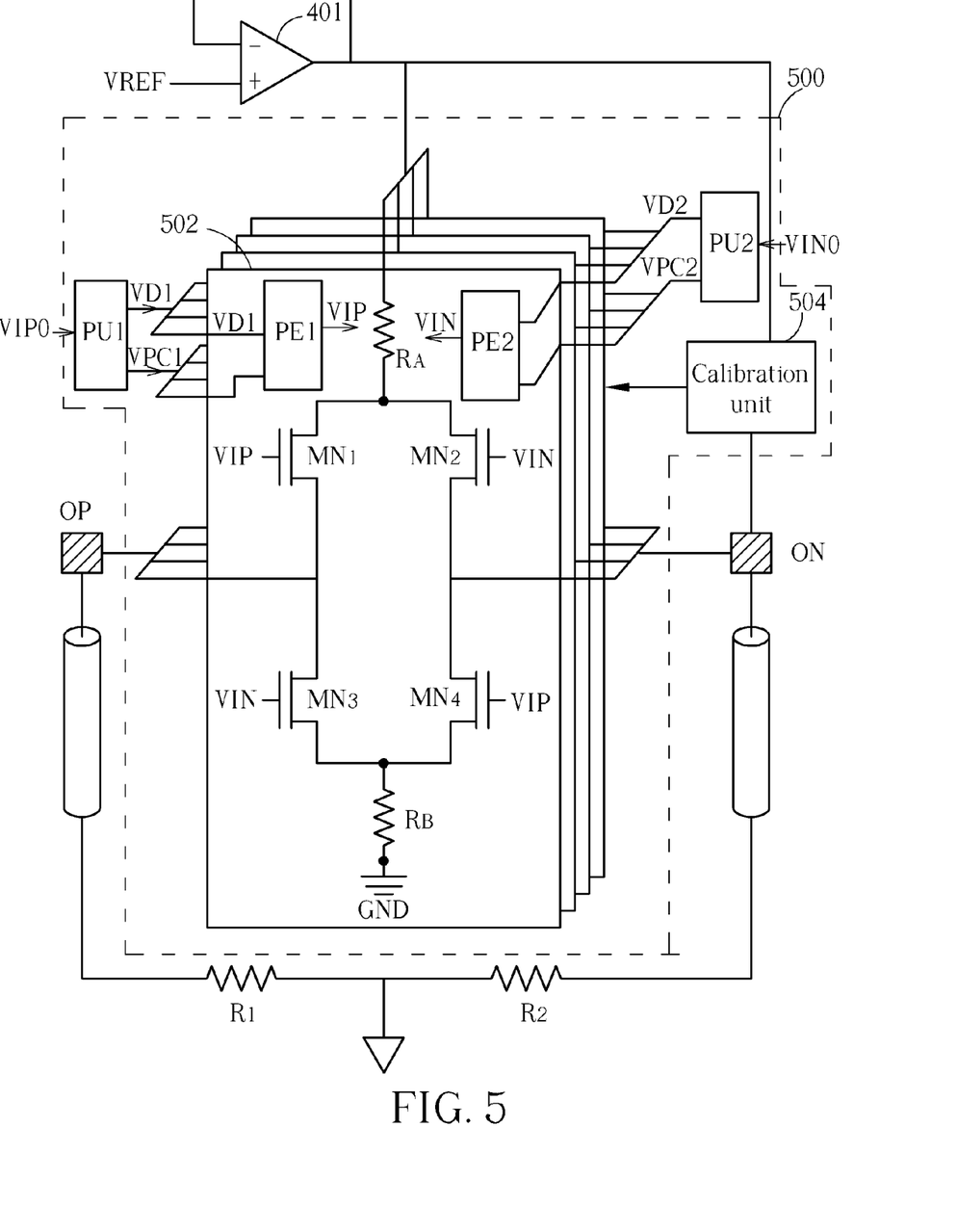
FIG. 5 is a driving circuit with impedance calibration functionality according to an embodiment of the present invention.

Due to the process variation, on-chip resistors usually suffer from a 30% variation and cannot achieve a proper matching. Therefore, in order to calibrate the output impedances to be substantially 50 ohms, a conventional driver adopts a current mirror pair and an additional pin connecting to a more accurate external resistor for calibration. However, an additional pin and an external resistor imply an extra cost and are therefore not favorable for commercial consideration. Please refer to FIG. 5, which is a driving circuit with impedance calibration functionality according to an embodiment of the present invention. The driving circuit 500 in FIG. 5 includes, but is not limited to, a plurality of driving units 502 each having a circuit architecture identical to that of the exemplary driving unit 402 shown in FIG. 4, and a calibration unit 504, wherein all of the driving units 502 are connected between the output nodes OP and ON of the driving circuit 500. For simplicity, only four driving units are shown in FIG. 5; however, this is for illustrative purposes only, and the total number of the implemented driving units depends upon actual design requirements. In this exemplary embodiment, the calibration unit 504 determines how many driving units 502 would be activated according to a voltage swing on an output node of the driving circuit 500 (e.g., the output node ON). Please refer to FIG. 6, which is an embodiment of the calibration unit 504 shown in FIG. 5 according to the present invention. As shown in the figure, the calibration unit 504 includes a target voltage generator 610, a comparator 620 and a control logic 630. The target voltage generator 610 includes four identical resistors, which are fabricated on chip and connected in series, for voltage dividing purpose.

Please refer to FIG. 4 again. Assuming all MOS transistors have zero on-resistance when conducting, while the input voltage VIP is high, the signal travels through four resistors (i.e., the first bias component $R_A$, loads R1 and R2, and the second bias component $R_B$), and the resistances of the four resistors are the same (e.g., 50 ohms) due to the impedance matching consideration, and therefore the output voltage VOP is three-quarters of the supply voltage TXVDD and the output voltage VON is one-quarter of the supply voltage TXVDD, i.e., VOP: VON=3:1. When a process variation occurs, the resistances of the first and second bias components $R_A$ and $R_B$ may not be close to 50 ohms, and the eventual outcome of output voltages VOP and VOP at output nodes NP and ON, respectively, will not be able to maintain a desired 3:1 ratio, leading to a poor impedance matching and a poor signal integrity. With the help of the target voltage generator 610, the output voltage VON can be properly adjusted according to a target voltage VONR generated from a voltage dividing architecture implemented in the target voltage generator 610 shown in FIG. 6. Since the target voltage VONR is derived by a resistor ratio rather than exact resistance values, the process variation can be substantially suppressed.

Figure 6:
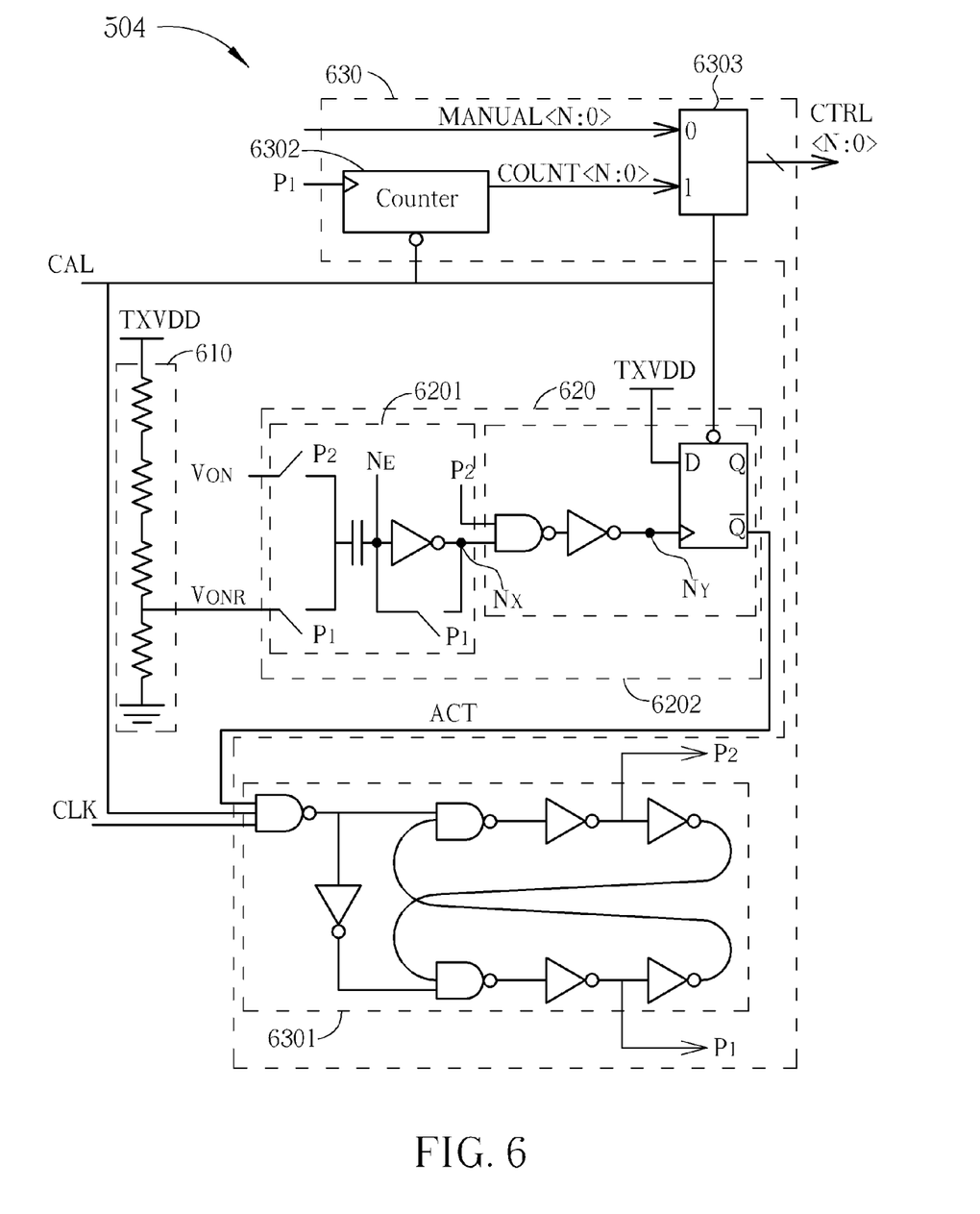
FIG. 6 is an embodiment of a calibration unit in FIG. 5 according to the present invention.

The comparator 620 compares a voltage level of the output voltage VON and the target voltage VONR according to two clock signals P1 and P2, which are generated from the control logic 630, and thereby generates a comparison output ACT. In this embodiment, the comparator 620 includes a sampling and adjusting element 6201 and a determining element 6202. The sampling and adjusting element 6201 samples the target voltage VONR to generate a sampled voltage at an output node Nx according to the clock signal P1, and thereby adjusts the sampled voltage according to a difference between the target voltage VONR and the output signal VON to generate an adjusted voltage at the output node Nx. The determining element 6202 generates the comparison output ACT according to a voltage level at the output node Nx of the sampling and adjusting element 6201. The control logic 630 generates a control signal CTRL<N: 0> (please note that each of the control signal CTRL<N: 0> can also be utilized to control the power down state of corresponding pre-emphasis unit as the power down signal) to control the number of driving units to be activated according to the comparison output ACT.

An operation of the calibration unit 504 is detailed as follows. First of all, only one driving unit is activated, a calibration signal CAL is enabled and activates a clock generator 6301 within the control logic 630, and the clock generator 6301 generates two out-of-phase clock signals P1 and P2 according to a reference clock signal CLK. That is, the clock signal P2 is an inverse version of the clock signal P1. When the clock signal P1 is high (which implies that the clock signal P2 is low), the voltage level of the target voltage VONR is stored at Nx whereas a voltage level at Ny is fixed as low. When the clock signal P1 goes low (i.e., the clock signal P2 is high), the voltage level of the output voltage VON is introduced; if the output voltage VON is higher than the target voltage VONR, the voltage level at Nz is enhanced by an amount equal to a difference between VON and VONR, and the voltage level at Nx is thereby low and the voltage level at Ny is kept low; if the output voltage VON is lower than the target voltage VONR, the voltage level at Nz is lowered by an amount equal to a difference between VON and VONR, the voltage level at Nx is thereby high and the voltage level at Ny turns out to be high and triggers a following D flip-flop and activates the comparison output ACT to stop the clock generator 6301.

When the clock generator 6301 starts outputting clock signals P1 and P2, the clock signal P1 is transmitted to a counter 6302 within the control logic 630 to count accordingly until the comparison output ACT stops the clock generator 6301. A control signal generator 6303, which is a multiplexer in this embodiment, receives counting signals COUNT<N:0> from the counter 6302 and determines to output the counting signals COUNT<N:0> or manually-set signals MANUAL<N:0> as the control signal CTRL<N:0>. Please note that the embodiment above is only for illustrative purposes and is not supposed to be a limitation of the present invention. For example, the driving units 502 within the driving circuit 500 can utilize a thermometer-code method to distribute the output impedances of the driving units 502 in a binary fashion, and the control signal generator 6303 converts the counting signals COUNT<N:0> into a binary-type control signal to control the number of the driving units to be enabled.

The exemplary driving circuit 600 of the present invention activates only one driving unit in the beginning, which implies a relatively large voltage level at the output node ON, the clock generator 6301 starts generating clock signals P1 and P2, and the counter 6302 also starts counting up according to clock cycles of the clock signal P1 such that the control signal generator 6303 outputs the control signal to activate more driving units 502 within the driving circuit 500. The more driving units 502 are activated, the smaller the output impedance at the output node ON (since more output impedances of the driving units are connected in parallel), leading to a voltage drop of the output voltage VON at the output node ON. Once the output voltage VON is lower than the target voltage VONR, the comparator 620 enables a comparison output ACT to stop the clock generator 630, and the counter 6302 also stops counting. In this way, the number of the driving units needed to be enabled is determined.

Figure 7:
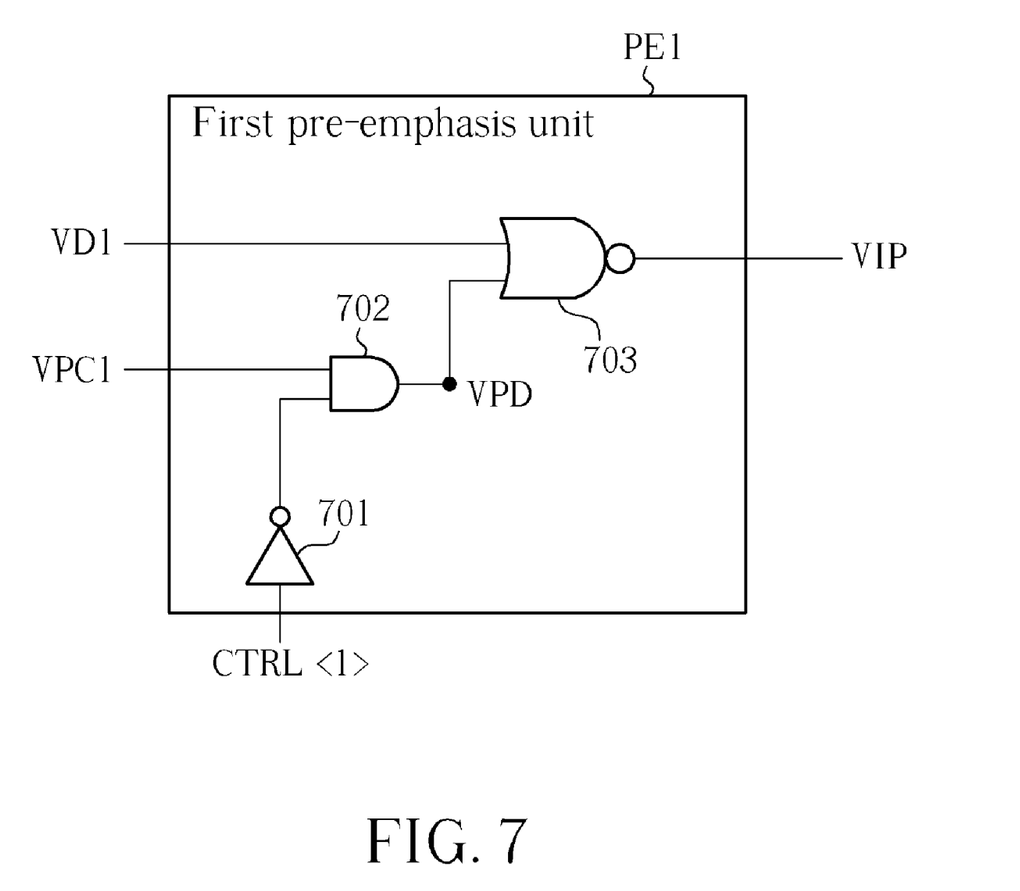
FIG. 7 is an embodiment of the first pre-emphasis unit in FIG. 4 according to the present invention.

Please refer to FIG. 7 for a further illustration of the first pre-emphasis unit PE1 in FIG. 4. In this exemplary implementation, the first pre-emphasis unit PE1 includes an inverter 701, an AND gate logic 702 and a NOR gate logic 703. Here, the NOR logic gate 703 serves as a power down circuit. Therefore, when an output signal VPD of the AND logic gate 702 is set by a logic value "1", an output signal of the NOR logic gate 703, i.e., the first pre-emphasis signal VPE1, is set by a constant logic value "0" regardless of the first driving signal VD1; additionally, when the output signal VPD is set by "0", the first pre-emphasis signal VPE1 is an inversion of the first driving signal VD1. The AND logic gate 702 receives the first pre-emphasis control signal VPC1 and an inversion of the power down signal CTRL<1>. When the power down signal CTRL<1> is set by a logic value "0", an output signal VPD of the AND logic gate 702 will track a logic level of the first pre-emphasis control signal VPC1 and therefore the pre-emphasis function can be performed; when the power down signal CTRL<1> is set by a logic level "1", the output signal VPD will be set as a constant logic level "0", and the first pre-emphasis signal VIP is set by a constant logic value "0". Since the rule of generating the second pre-emphasis unit PE2 is substantially identical to that of the first pre-emphasis unit PE1, detailed description is omitted here for brevity.

Figure 8:
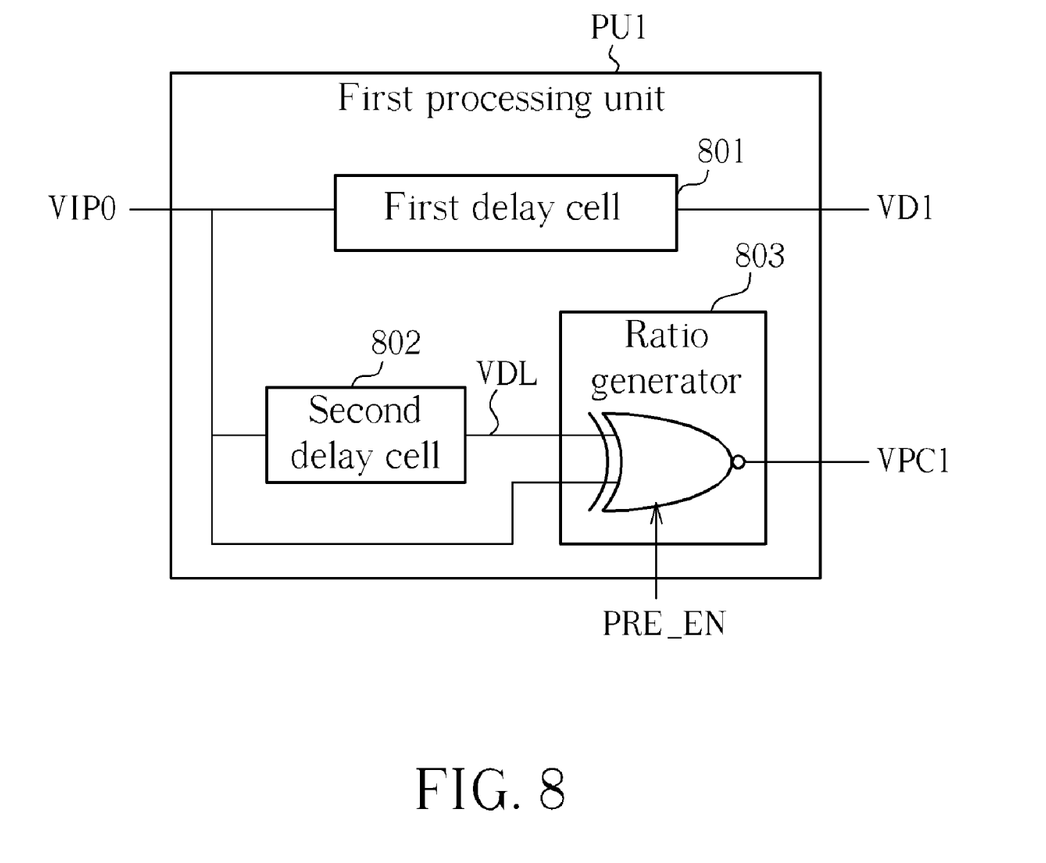
FIG. 8 is an exemplary block diagram of the first processing unit in FIG. 4 according to an embodiment of the present invention.

Please refer to FIG. 8 for a further illustration of the first processing unit PU1. FIG. 8 is an exemplary block diagram of the first processing unit PU1 in FIG. 4 according to an embodiment of the present invention. In this exemplary implementation, the first processing unit PU1 has a first delay cell 801, a second delay cell 802 and a ratio generator 803. The first delay cell 801 receives the first input signal VIP0 and delays the first input signal VIP0 to thereby generate the first driving signal VD1, wherein the delay time provided by the first delay cell 801 matches a processing time of the second delay cell 802 and the ratio generator 803. The second delay cell 802 receives the first input signal VIP0 and delays the first input signal VIP0 to generate a delayed signal VDL. The ratio generator 803 is implemented for receiving the first input signal VIP0, the delayed signal VDL and a pre-emphasis enable signal PRE_EN, and generating the first pre-emphasis control signal VPC1 according to the first input signal VIP0 and the delayed signal VDL, if enabled by the pre-emphasis enable signal PRE_EN. More specifically, the ratio generator 803 is enabled to perform the pre-emphasis functionality when the pre-emphasis enable signal PRE_EN is set by a logic value "1"; however, when the pre-emphasis enable signal PRE_EN is set by a logic value "0", an output signal of the ratio generator 803, i.e. the first pre-emphasis control signal VPC1, is set by a constant logic level (e.g., a logic value "1" in this embodiment) and no pre-emphasis functionality is executed. Since the structure and operation of the second processing unit PU2 are substantially identical to that of the first processing unit PU1, detailed description is omitted here for brevity.

Figure 9:
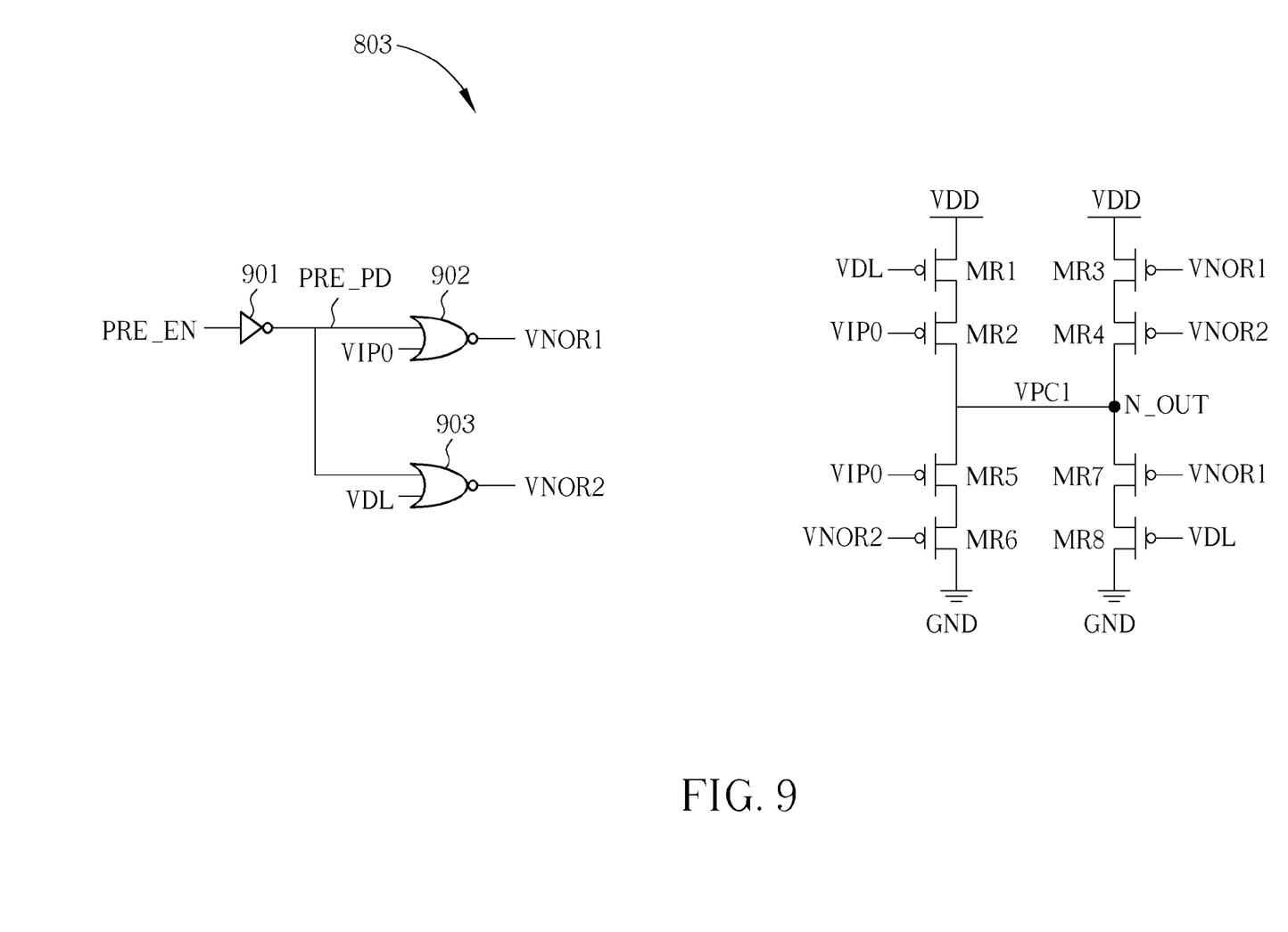
FIG. 9 is an exemplary circuit diagram of the ratio generator in FIG. 8 according to an embodiment of the present invention.

The ratio generator 803 in this embodiment can be implemented using an XNOR logic gate with an enabling function. Please refer to FIG. 9, which is an exemplary circuit diagram of the ratio generator 803 in FIG. 8. The exemplary implementation of the ratio generator 803 includes an inverter 901, a first NOR logic gate 902, a second NOR logic gate 903 and a plurality of MOS transistors MR1~MR8. The inverter 901 provides a pre-emphasis power down signal PRE_PD, i.e., an inversion of the pre-emphasis enable signal PRE_EN, for the first NOR logic gate 902 and the second NOR logic gate 903. The first NOR logic gate 902 receives the pre-emphasis power down signal PRE_PD and the first input signal VIP0 and thereby generates a first NOR signal VNOR1. Likewise, the second NOR logic gate 903 receives the pre-emphasis power down signal PRE_PD and the delayed signal VDL and thereby generates a second NOR signal VNOR2. The first MOS transistor MR1 has a control node for receiving the delayed signal VDL, a first node coupled to the first reference voltage VDD, and a second node. The second MOS transistor MR2 has a control node for receiving the first input signal VIP0, a first node coupled to the second node of the first MOS transistor MR1, and a second node coupled to an output port N_OUT utilized for outputting the first pre-emphasis control signal VPC1. The third MOS transistor MR3 has a control node for receiving the first NOR signal VNOR1, a first node coupled to the first reference voltage VDD, and a second node. The fourth MOS transistor MR4 has a control node for receiving the second NOR signal VNOR2, a first node coupled to the second node of the third MOS transistor MR3, and a second node coupled to the output port N_OUT. The fifth MOS transistor MR5 has a control node for receiving the first input signal VIP0, a first node coupled to the output port N_OUT, and a second node. The sixth MOS transistor MR6 has a control node for receiving the second NOR signal VNOR2, a first node coupled to the second node of the fifth MOS transistor MR5, and a second node coupled to the second reference voltage GND. The seventh MOS transistor MR7 has a control node for receiving the first NOR signal VNOR1, a first node coupled to the output port N_OUT, and a second node. The eighth MOS transistor MR8 has a control node for receiving the delayed signal VDL, a first node coupled to the second node of the seventh MOS transistor MR7, and a second node coupled to the second reference voltage GND. As details of the proposed circuitry in FIG. 9 are self-explanatory, further description is omitted here for brevity.

Figure 10:
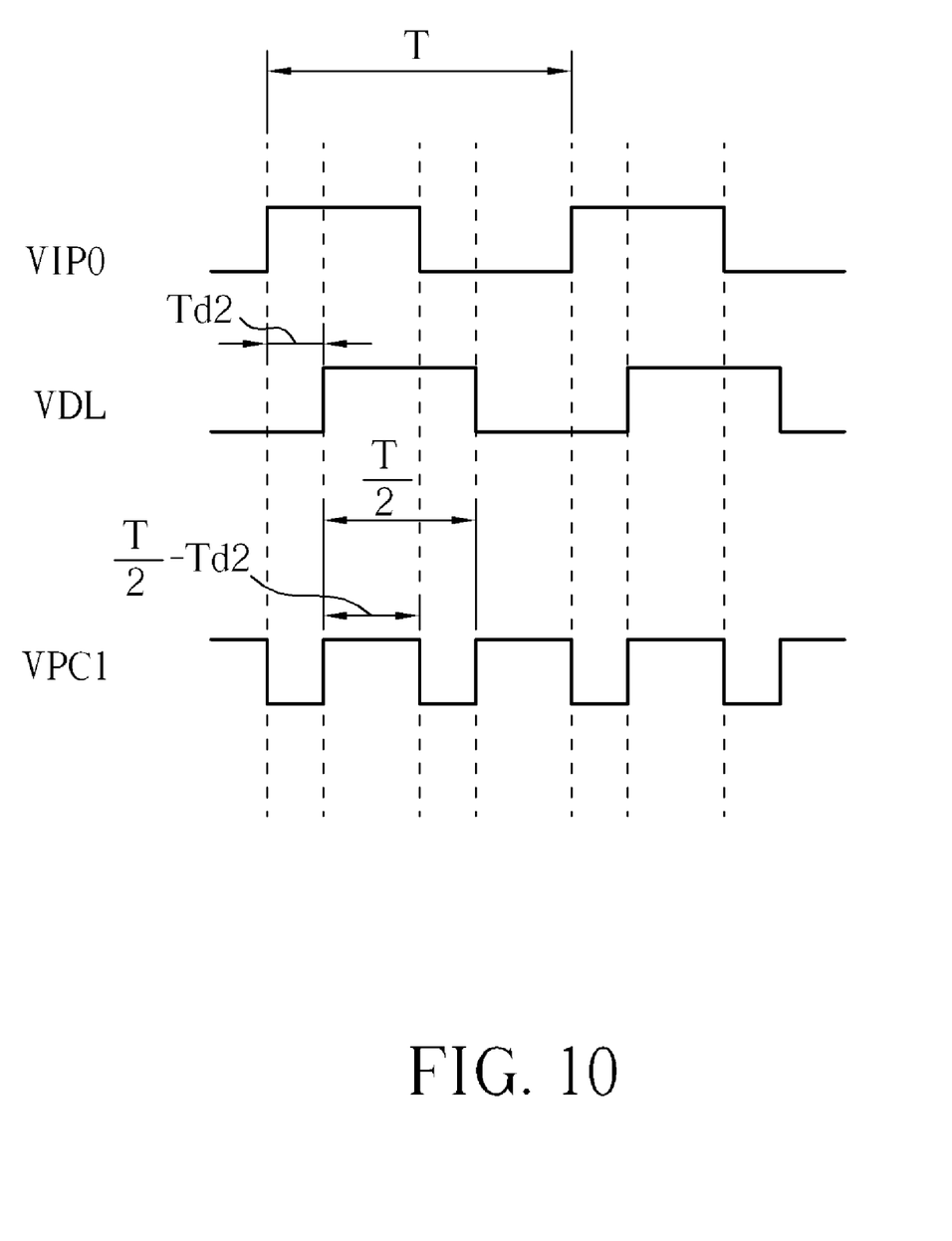
FIG. 10 is an exemplary timing diagram of signals in FIG. 8 according to an embodiment of the present invention.

Please note that the first delay cell 801 and the second delay cell 802 provide a proper time delay for pre-emphasis functionality. For example, referring to FIG. 10, the first input signal VIP0 has a period T and the second delay cell 802 provides a time delay $T_{d2}$ for the first input signal VIP0 to generate the delayed signal VDL, which is further utilized for pre-emphasis functionality. The first pre-emphasis control signal VPC1 is a pulse train with a period of T/2 and a duty cycle $(T/2-T_{d2})/(T/2)$. Please refer to FIG. 7 again. When the first pre-emphasis control signal VPC1 is set by "0", the first pre-emphasis signal VIP will follow an inversion of the first driving signal VD1 regardless of the logic level of the output signal VPD of the AND logic gate 702.

Figure 11:
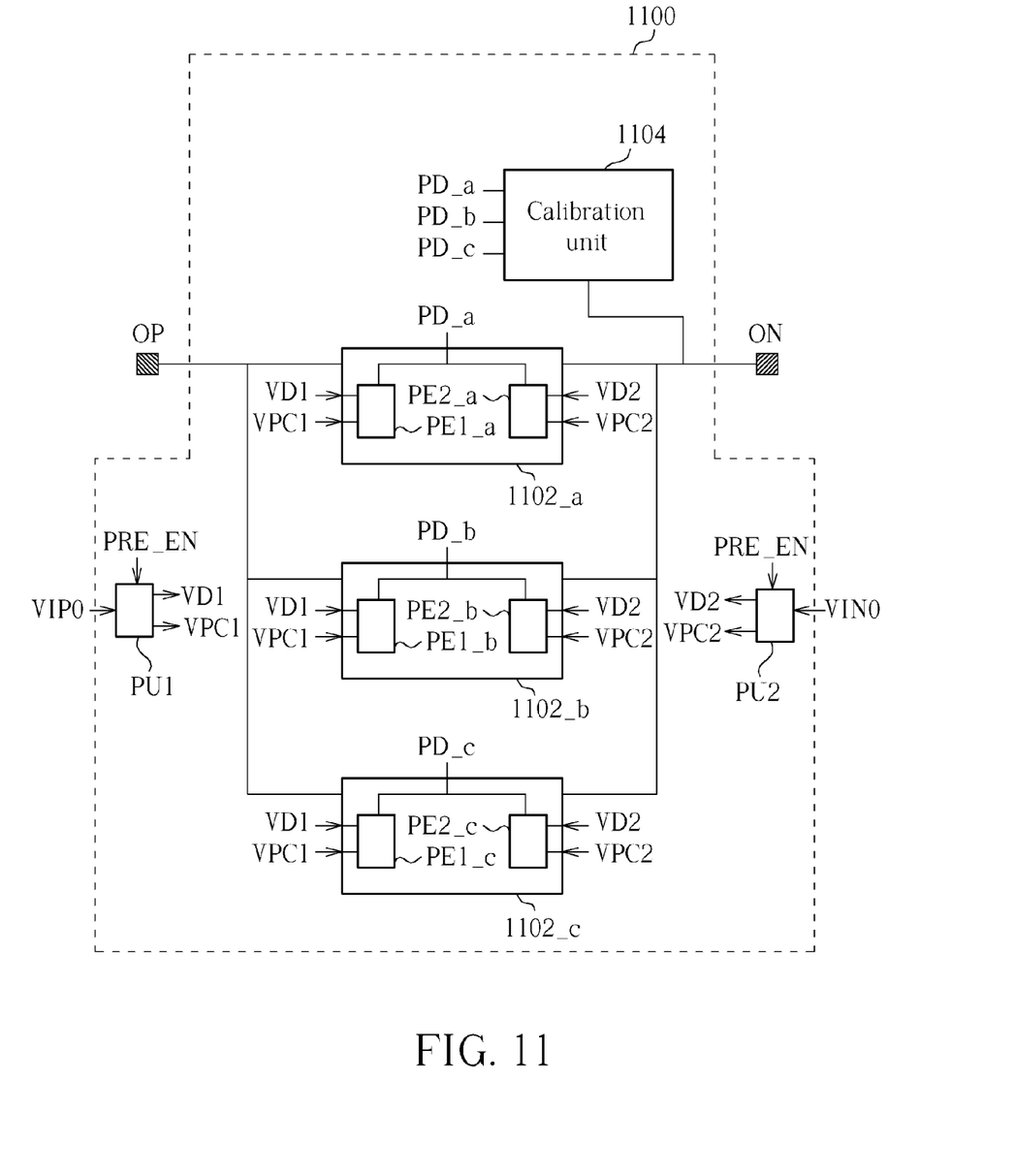
FIG. 11 is a block diagram of a driving circuit with calibration and pre-emphasis functionalities according to an embodiment of the present invention.
Figure 12:
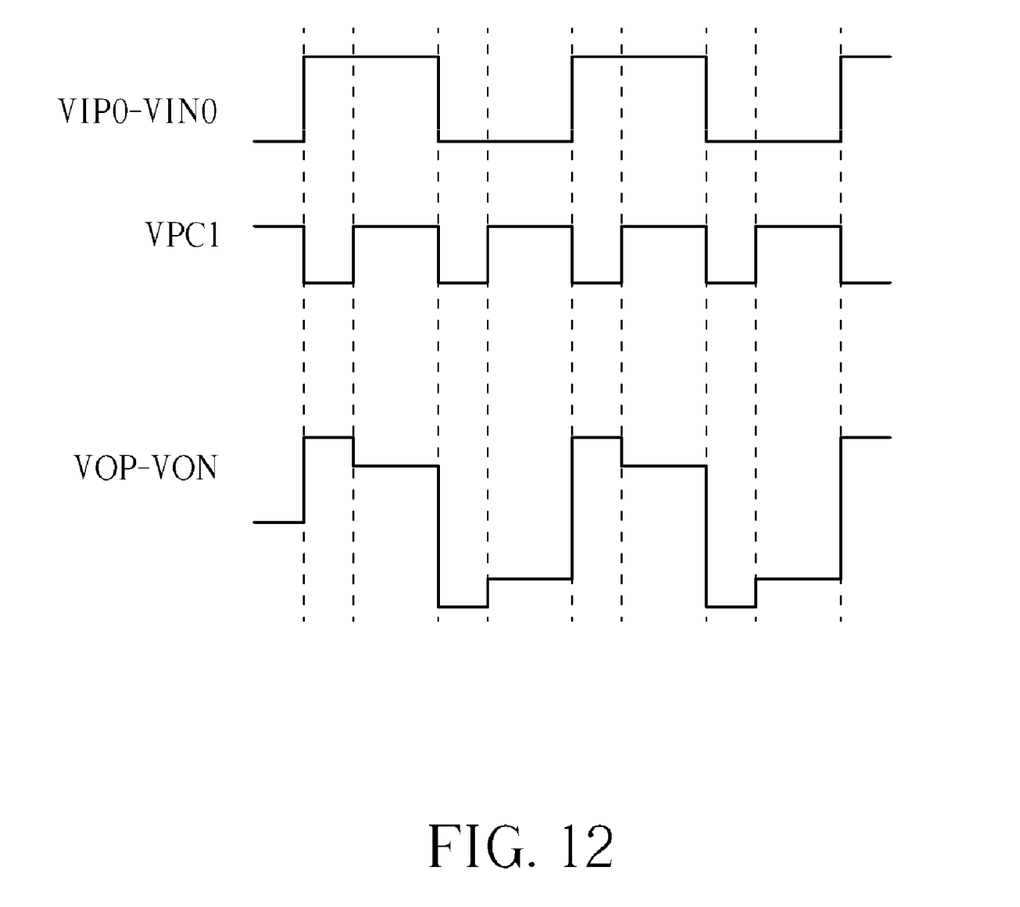
FIG. 12 is an exemplary timing diagram of signals in FIG. 11 according to an embodiment of the present invention.

Please refer to FIG. 11 for a further illustration of a preferred embodiment of the present invention. FIG. 11 is a block diagram of a driving circuit with calibration and pre-emphasis functionalities according to an embodiment of the present invention, wherein some components and connections are omitted for brevity and clarity. In FIG. 11, the driving units 1102_a, 1102_b and 1102_c are substantially identical to the driving unit 502 in FIG. 5 and each corresponding pre-emphasis unit receives corresponding power down signal (i.e., a first power signal PD_a corresponding to pre-emphasis units PE1_a and PE2_a, a second power signal PD_b corresponding to pre-emphasis units PE1_b and PE2_b, and a third power down signal CTRL<1>_c corresponding to pre-emphasis units PE1_c and PE2_c) generated from a calibration unit 1104 (the calibration unit 1104 is substantially the same as the calibration unit 504). Assuming that the calibration unit 1104' determines that only driving units 1102_a and 1102_b are active after auto-calibration, the power down signals PD_a and PD_b are set by "0" whereas the power down signal CTRL<1>_c is set by "1". However, when the pre-emphasis function is activated (i.e. the pre-emphasis enable signal PRE_EN is set by "1"), the driving unit 1102_c will still be active when the first pre-emphasis control signal VPC1 is set by "0". Please refer to FIG. 12 in conjunction with FIG. 11. Regarding a differential input signal VIP0-VIN0, the first processing unit PU1 of the driving circuit 1100 will generate the first pre-emphasis control signal VPC1, wherein the period of the first pre-emphasis control signal VPC1 is half the period of the differential input signal VIP0-VIN0, and an adjustable duty cycle of the first pre-emphasis control signal VPC1. Since the driving unit 1102_c will be active when the first pre-emphasis control signal VPC1 is set by "0", and the output differential signal VOP-VON will present a pre-emphasis characteristic and be enhanced at each rising edge and falling edge with a proper setting of corresponding delay times in the first processing unit PU1 and the second processing unit PU2. In other embodiments, the number of driving units can be selectively chosen to perform the pre-emphasis unit with corresponding programmed delay times in the first processing unit PU1 and the second processing unit PU2, leading to a more robust transmission via long distances regardless of high-frequency attenuation.

In accordance with exemplary embodiments of the present invention, a driving circuit, which has pre-emphasis and auto-calibration functionalities and is suitable for low-power high-speed operations, is provided. Adopting NMOS type transistors provides lower threshold voltage as well as lower power requirement, and the utilization of resistors as bias components provides proper matching with loads to be driven. Additionally, with the help of a simple on-chip calibration unit and a few pre-emphasis related components, no excessive cost is spent on additional pins and external resistors.

Those skilled in the art will readily observe that numerous modifications and alterations of the device and method may be made while retaining the teachings of the invention.

What is claimed is:

1. A driving circuit, comprising:
 at least a driving unit, comprising:
 a first bias component, having a first node coupled to a first reference voltage, and a second node for outputting a first bias current;
 a second bias component, having a first node for draining a second bias current, and a second node coupled to a second reference voltage different from the first reference voltage;
 a first pre-emphasis unit, for receiving a first driving signal and a first pre-emphasis control signal, and generating a first pre-emphasis output signal according to the first driving signal and the first pre-emphasis control signal;
 a second pre-emphasis unit, for receiving a second driving signal and a second pre-emphasis control signal, and generating a second pre-emphasis signal according to the second driving signal and the second pre-emphasis control signal; and
 a transmitter unit, coupled to a first output port a second port of the driving circuit, for receiving the first pre-emphasis signal and the second pre-emphasis signal;
 a first processing unit, coupled to the first pre-emphasis unit for receiving a first input signal and generating the first driving signal and the first pre-emphasis control signal according to the first input signal; and
 a second processing unit, coupled to the second pre-emphasis unit for receiving a second input signal and generating the second driving signal and the second pre-emphasis control signal according to the second input signal.

2. The driving circuit of claim 1, wherein the transmitter unit comprises:
 a first transistor, having a control node coupled to the first pre-emphasis unit for receiving the first pre-emphasis signal, a first connection node coupled to the second node of the first bias component, and a second connection node coupled to the first output port of the driving circuit;
 a second transistor, having a control node coupled to the second pre-emphasis unit for receiving the second pre-emphasis signal, a first connection node coupled to the second node of the first bias component, and a second connection node coupled to the second output port of the driving circuit;
 a third transistor, having a control node coupled to the second pre-emphasis unit for receiving the second pre-emphasis signal, a first connection node coupled to the first output port of the driving circuit, and a second connection node coupled to the first node of the second bias component; and
 a fourth transistor, having a control node coupled to the first pre-emphasis unit for receiving the first pre-emphasis signal, a first connection node coupled to the second output port of the driving circuit, and a second connection node coupled to the first node of the second bias component.

3. The driving circuit of claim 1, wherein at least one of the first processing unit and the second processing unit comprises:
 a first delay cell, coupled to a corresponding pre-emphasis unit, for receiving a corresponding input signal and delaying the corresponding input signal to generate a corresponding driving signal;
 a second delay cell, for receiving the corresponding input signal and delaying the corresponding input signal to generate a delayed signal; and
 a ratio generator, coupled to the second delay cell and the first pre-emphasis unit, for receiving the corresponding input signal and the delayed signal and generating a corresponding pre-emphasis control signal according to the corresponding input signal and the delayed signal.

4. The driving circuit of claim 3, wherein the ratio generator is an XNOR logic gate.

5. The driving circuit of claim 3, wherein the ratio generator further receives a pre-emphasis enable signal for controlling whether the corresponding pre-emphasis control signal is set to be constant.

6. The driving circuit of claim 5, wherein the ratio generator comprises:
a plurality of NOR logic gates, comprising:
a first NOR logic gate, for receiving a pre-emphasis power down signal and the corresponding input signal to generate a first NOR signal, wherein the pre-emphasis power down signal is derived from the pre-emphasis enable signal; and
a second NOR logic gate, for receiving the pre-emphasis power down signal and the delayed signal to generate a second NOR signal;
a first transistor, having a control node for receiving the delayed signal, a first node coupled to the first reference voltage, and a second node;
a second transistor, having a control node for receiving the corresponding input signal, a first node coupled to the second node of the first transistor, and a second node coupled to an output port utilized for outputting the corresponding pre-emphasis control signal;
a third transistor, having a control node for receiving the first NOR signal, a first node coupled to the first reference voltage, and a second node;
a fourth transistor, having a control node for receiving the second NOR signal, a first node coupled to the second node of the third transistor, and a second node coupled to the output port;
a fifth transistor, having a control node for receiving the corresponding input signal, a first node coupled to the output port, and a second node;
a sixth transistor, having a control node for receiving the second NOR signal, a first node coupled to the second node of the fifth transistor, and a second node coupled to the second reference voltage;
a seventh transistor, having a control node for receiving the first NOR signal, a first node coupled to the output port, and a second node; and
an eighth transistor, having a control node for receiving the delayed signal, a first node coupled to the second node of the seventh transistor, and a second node coupled to the second reference voltage.

7. The driving circuit of claim 6, wherein at least one of the first ratio generator and the second ratio generator further comprises:
an inverter, coupled to the first NOR logic gate and the second NOR logic gate, for receiving the pre-emphasis enable signal to generate the pre-emphasis power down signal.

8. The driving circuit of claim 1, wherein at least one of the first pre-emphasis unit and the second pre-emphasis unit comprises:
a NOR logic gate, for receiving a corresponding driving signal and a power-down signal to generate a corresponding pre-emphasis output signal, wherein the power-down signal is derived from a corresponding pre-emphasis control signal.

9. The driving circuit of claim 8, wherein at least one of the first pre-emphasis unit and the second pre-emphasis unit further receives a power down signal for controlling the corresponding pre-emphasis signal being set constant.

10. The driving circuit of claim 9, wherein at least one of the first pre-emphasis unit and the second pre-emphasis unit further comprises:
an AND logic gate, for receiving the corresponding pre-emphasis control signal and a logic control signal to generate the power-down signal, wherein the logic control signal is derived from the power down signal.

11. The driving circuit of claim 10, wherein at least one of the first pre-emphasis unit and the second pre-emphasis unit further comprises:
an inverter, for receiving the power down signal to generate the logic control signal.

12. The driving circuit of claim 2, wherein the first transistor, the second transistor, the third transistor, and the fourth transistor are of a same conductive type.

13. The driving circuit of claim 2, wherein each of the first transistor, the second transistor, the third transistor, and the fourth transistor is an N-channel MOS (NMOS) transistor.

14. The driving circuit of claim 2, wherein the first input signal and the second input signal are a differential signal pair.

15. The driving circuit of claim 1, wherein each of the first bias component and the second bias component is a resistor.

16. The driving circuit of claim 1, wherein the driving circuit comprises a plurality of driving units each coupled between the first reference voltage and the second reference voltage; and the driving circuit further comprises:
a calibration unit, coupled to the driving units, for activating at least one of the driving units according to an output signal of one of the first output port and the second port of the driving circuit.

17. The driving circuit of claim 16, wherein the calibration unit comprises:
a target voltage generator, for generating a target voltage;
a comparator, coupled to the target voltage generator and one of the first output port and the second port of the driving circuit, for comparing a voltage level of the output signal with the target voltage to generate a comparison output; and
a control logic, coupled to the comparator, for generating a control signal to control a number of activated driving units according to the comparison output.

18. The driving circuit of claim 17, wherein the target voltage is set according to at least an impedance of each load driven by the driving circuit and impedances of the first bias component and the second bias component.

19. The driving circuit of claim 17, wherein the control logic comprises:
a clock generator, for generating at least a first clock signal according to a reference clock, wherein when the voltage level of the output signal is substantially equal to the target voltage, the comparison output generated from the comparator stops the clock generator from generating the first clock signal; and
a counter, coupled to the clock generating, for generating a counter value according to the first clock signal, wherein the control signal is derived from the counter value.

20. The driving circuit of claim 17, wherein the control logic comprises:
a control signal generator, coupled to the counter, for converting the counter value into the control signal.

21. The driving circuit of claim 17, wherein the clock generator further generates a second clock signal according to the reference clock, where the first clock signal and the second clock signal are 180 degrees out of phase; and the comparator comprises:
a sampling and adjusting element, for sampling the target voltage to generate a sampled voltage at an output node according to the first clock signal, and for adjusting the sampled voltage according to a difference between the target voltage and the voltage level of the output signal to thereby generate an adjusted voltage; and a determining element, coupled to the sampling and adjusting element, for generating the comparison output according to a voltage level at the output node of the sampling and adjusting element.

22. The driving circuit of claim 1, wherein the first reference voltage and the second voltage reference comply with a Mobile Processor Interface (MIPI) standard.

* * * * *